US012805273B2

(12) United States Patent
(10) Patent No.: US 12,805,273 B2
(45) Date of Patent: Nov. 17, 2026

Quintero-Colmenares et al.

(54) METHOD FOR MANUFACTURING A NON-DEFORMABLE P-SiC WAFER

(71) Applicant: Soitec, Bernin (FR)

(72) Inventors: Andrea Quintero-Colmenares, Bernin (FR); Frédéric Allibert, Bernin (FR); Alexis Drouin, Bernin (FR); Séverin Rouchier, Bernin (FR); Walter Schwarzenbach, Bernin (FR); Hugo Biard, Bernin (FR); Loïc Kabelaan, Bernin (FR); Oleg Kononchuk, Bernin (FR); Sidoine Odoul, Bernin (FR); Jérémy Roi, Bernin (FR)

(73) Assignee: Soitec, Bernin (FR)

( * ) Notice: Subject to any disclaimer, the term of this patent is extended or adjusted under 35 U.S.C. 154(b) by 296 days.

(21) Appl. No.: 18/834,122

(22) PCT Filed: Jan. 27, 2023

(86) PCT No.: PCT/FR2023/050109
§ 371 (c)(1),
(2) Date: Jul. 29, 2024

(87) PCT Pub. No.: WO2023/144493
PCT Pub. Date: Aug. 3, 2023

(65) Prior Publication Data

US 2025/0125140 A1 Apr. 17, 2025

(30) Foreign Application Priority Data

Jan. 28, 2022 (FR) ....................................... 2200766

(51) Int. Cl.
*H10P 90/00* (2026.01)
*H10P 14/20* (2026.01)
*H10P 95/90* (2026.01)

(52) U.S. Cl.
CPC ........ *H10P 90/123* (2026.01); *H10P 14/3408* (2026.01); *H10P 90/124* (2026.01); *H10P 90/18* (2026.01); *H10P 95/90* (2026.01)

(58) Field of Classification Search
CPC ...... H10P 90/123; H10P 90/18; H10P 90/124; H10P 95/90; H10P 14/3408
See application file for complete search history.

(56) References Cited

U.S. PATENT DOCUMENTS

| | | | |
|---|---|---|---|
| 2014/0117380 | A1 | 5/2014 | Loboda et al. |
| 2016/0204023 | A1 | 7/2016 | Imaoka et al. |
| 2018/0334757 | A1 | 11/2018 | Kubota et al. |

FOREIGN PATENT DOCUMENTS

| | | | | |
|---|---|---|---|---|
| JP | 2014-213403 | A | | 11/2014 |
| JP | 2021095584 | A | * | 6/2021 |

OTHER PUBLICATIONS

International Search Report for Application No. PCT/FR2023/050109 dated Jun. 9, 2023, 2 pages.

(Continued)

*Primary Examiner* — Lauren R Bell
(74) *Attorney, Agent, or Firm* — TraskBritt

(57) ABSTRACT

A method of manufacturing a polycrystalline silicon carbide wafer includes the following stages: heat treatment of a polycrystalline silicon carbide slab; thinning of the polycrystalline silicon carbide slab, the thinning comprising a correction, by withdrawal of material from the polycrystalline silicon carbide slab, of a deformation brought about by the heat treatment.

18 Claims, 1 Drawing Sheet

(56) References Cited

OTHER PUBLICATIONS

International Written Opinion for Application No. PCT/FR2023/050109 dated Jun. 9, 2023, 9 pages with machine translation.
Korean Request for the Submission of an Opinion for Application No. 10-2024-7028821 dated Apr. 30, 2026, 18 pages with machine translation.

* cited by examiner

METHOD FOR MANUFACTURING A NON-DEFORMABLE P-SiC WAFER

CROSS-REFERENCE TO RELATED APPLICATIONS

This application is a national phase entry under 35 U.S.C. § 371 of International Patent Application PCT/FR2023/050109, filed Jan. 27, 2023, designating the United States of America and published as International Patent Publication WO 2023/144493 A1 on Aug. 3, 2023, which claims the benefit under Article 8 of the Patent Cooperation Treaty of French Patent Application Serial No. FR2200766, filed Jan. 28, 2022.

TECHNICAL FIELD

The field of the present disclosure is that of the manufacture of polycrystalline silicon carbide wafers intended, in particular, to act as supports for thin layers of single-crystal silicon carbide.

BACKGROUND

Silicon carbide (SiC) is increasingly widely used in power electronics applications, in particular, to meet the needs of growing ranges of electronics, such as, for example, electric vehicles. Power devices and integrated power-supply systems based on single-crystal SiC can actually manage a much higher power density than their conventional silicon counterparts, and do so with active regions of smaller size.

Nevertheless, the substrates made of single-crystal SiC intended for the microelectronics industry remain expensive and difficult to supply in large sizes. It is thus advantageous to resort to layer transfer solutions in order to produce composite structures typically comprising a thin layer made of single-crystal SiC on a lower cost support substrate. One well-known thin-layer transfer solution is the Smart Cut™ process, which is based on implanting light ions and on assembling by direct bonding. Such a process makes it possible, for example, to manufacture a composite structure comprising a thin layer made of single-crystal SiC, taken from a donor substrate made of single-crystal SiC, in direct contact with a support substrate made of polycrystalline SiC.

Nevertheless, these composite structures have a tendency to exhibit high bow ("bow" denoting a parabolic curve with symmetry of rotation with respect, in particular, to the center of the slab) and warp ("warp" denoting a deformation with a radius of curvature, which is positive in one axis and negative in the other) values. These high values are, in particular, the consequence of a relaxation in stresses, which are brought about by the manufacture of the support substrate made of polycrystalline SiC, which relaxation is liable to take place when the support substrate is subjected to a heat treatment during the SmartCut™ process (for example, during the separation annealing, generally carried out at a temperature of the order of 1300-1700° C., in order to operate the transfer of the thin layer from the donor substrate to the support substrate) or subsequent to the SmartCut™ process, during the formation of electronic components in the transferred thin layer (typically at temperatures of the order of 1800-2000° C.).

These high bow and deformation values are problematic in that they can result in the composite structure breaking or cause problems of alignment during the lithography stages necessary for the formation of the power components.

BRIEF SUMMARY

It is an objective of the present disclosure to provide a technique for the manufacture of a polycrystalline SiC wafer, which makes it possible to limit, indeed, even to eliminate, the risk of deformation of the wafer during subsequent heat treatments.

To this end, the present disclosure provides a process for the manufacture of a polycrystalline silicon carbide wafer, comprising the following stages:

- heat treatment of a polycrystalline silicon carbide slab;
- thinning of the polycrystalline silicon carbide slab, the thinning comprising a correction, by removal of material from the polycrystalline silicon carbide slab, of a deformation brought about by the heat treatment.

Some preferred but non-limiting aspects of this process are as follows:

- the removal of material is carried out by grinding the polycrystalline silicon carbide slab;
- the removal of material from the polycrystalline silicon carbide slab is carried out by electrical discharge machining;
- the removal of material is carried out both at the front face and at the rear face of the polycrystalline silicon carbide slab;
- the removal of material is carried out so that the wafer exhibits front and rear faces that are flat and parallel to each other;
- the thinning stage comprises the removal, on at least one of the faces of the slab, of a thickness of material of greater than or equal to 50 micrometers;
- it comprises a stage of manufacture of the slab by deposition of material on a growth substrate, and the stage of heat treatment is preceded by a stage of separation of the slab and of the growth substrate;
- the heat treatment is carried out at a temperature of between 1650° C. and 2000° C. for a period of time of greater than 10 minutes;
- the heat treatment comprises a stationary phase at 1850° C.;
- the heat treatment comprises a stationary phase and regulation of the fall in temperature from the stationary phase down to a target temperature;
- it comprises, before the heat treatment, the formation of the polycrystalline silicon carbide slab by deposition of polycrystalline silicon carbide on a growth substrate, followed by removal of the growth substrate;
- the heat treatment is carried out at a temperature greater than a temperature of the deposition of the polycrystalline silicon carbide on the growth substrate.

The present disclosure also extends to the manufacture of a composite structure by transfer of a thin layer made of single-crystal silicon carbide from a single-crystal silicon carbide substrate to a polycrystalline silicon carbide wafer manufactured in accordance with the present disclosure. This manufacture can additionally comprise the formation of electronic components in the transferred thin layer at a temperature lower than the temperature of the heat treatment applied during the manufacture of the wafer.

BRIEF DESCRIPTION OF THE DRAWINGS

Other aspects, aims, advantages and characteristics of the present disclosure will become more clearly apparent on reading the following detailed description of preferred embodiments of the latter, given by way of nonlimiting example and made with reference to the appended drawings, in which.

DETAILED DESCRIPTION

The present disclosure relates to a process for the manufacture of a polycrystalline silicon carbide (p-SiC) wafer from a p-SiC slab, the wafer exhibiting, by definition, a reduced thickness with respect to that of the slab.

A deposition of p-SiC on a growth substrate (for example, a graphite substrate), typically a chemical vapor deposition at a temperature of between 1200° C. and 1400° C., makes it possible to form a p-SiC slab, which is relatively thick (for example, with a thickness of 2 to 3 mm). There exist different crystal forms (also called polytypes) of silicon carbide. The commonest are the 4H, 6H and 3C forms. Preferably, the polytype of the p-SiC slab thus formed is the 3C polytype but all the polytypes can be envisaged for implementing the present disclosure.

Following the removal of the growth substrate, the p-SiC slab is subjected to a process of formation of one or more wafers (wafering process), which comprises various cleaning, etching, grinding and polishing stages and makes it possible to obtain one or more p-SiC wafers having a desired form (in particular, a beveled edge) and a desired thickness. Sawing can also be carried out during this process, in particular, when several wafers have to be manufactured from one and the same slab.

The removal of the growth substrate, when the latter is made of graphite, is, for example, carried out by combustion of the graphite. For this, a stage of heating in the presence of oxygen, for example, at a combustion temperature of greater than or equal to 800° C., is often used. The combustion temperature is frequently less than or equal to 1000° C.

According to the present disclosure, a heat treatment is inserted in this wafering process in order to prepare a wafer that will not be deformed during subsequent heat treatments, for example, during the implementation of the SmartCut™ process or during the preparation of electronic components. The wafering process is furthermore adapted in order for the wafer thus prepared to be flat and to exhibit neither bow nor warp.

Starting from a p-SiC slab separated from its growth substrate, the process according to the present disclosure for the manufacture of a p-SiC wafer thus comprises a heat treatment of the slab and a thinning of the slab.

Figure 1:
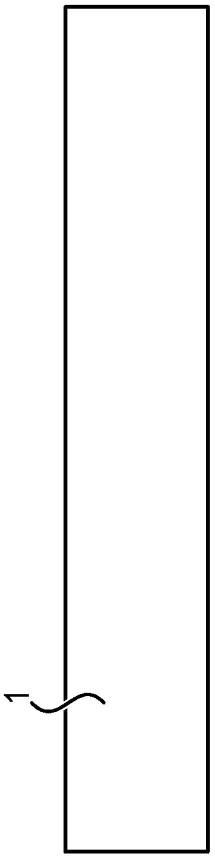
FIG. 1 is a diagram illustrating a polycrystalline silicon carbide slab after a surface smoothing stage.

In a possible embodiment illustrated by FIG. 1, the stage of heat treatment can be preceded by a stage of smoothing the p-SiC slab 1. This surface smoothing can be carried out by grinding or by mechanical or chemical-mechanical polishing. It can furthermore make it possible to remove the growth seed of the p-SiC crystal used during the formation of the slab 1.

In another possible embodiment, which may or may not be combined with the preceding embodiment, the stage of heat treatment is preceded by stage of cleaning the p-SiC slab 1.

The heat treatment is carried out at a temperature greater than a temperature of the deposition of the p-SiC on the growth substrate during the formation of the slab. This heat treatment is furthermore carried out at a temperature greater than the highest temperature of the subsequent heat treatment(s), for example, greater than the temperature of a subsequent manufacturing heat treatment of electronic components.

The heat treatment is preferably carried out at a temperature of between 1650° C. and 2000° C. for a period of time of greater than 10 minutes. This heat treatment can, in particular, be carried out at a temperature of at least 1700° C., for example, at 1850° C., at 1900° C. or also at 2000° C. The heat treatment can comprise temperature rise/fall gradients of between 10° C./minute and 100° C./minute.

The heat treatment can be carried out at low pressure (typically at less than 100 mbar, for example, at less than 50 mbar, in particular, between 10 and 30 mbar), or also at a pressure of greater than 100 mbar, indeed even at atmospheric pressure.

The heat treatment is typically carried out under a neutral atmosphere, for example, under an argon or nitrogen atmosphere.

The heat treatment can comprise a stationary phase. It can also be carried out with regulation of the fall in temperature from the stationary phase down to a target temperature. In an implementational example, the heat treatment comprises a stationary phase at 1850° C. This stationary phase can exhibit a duration of 30 minutes. The rise in temperature can be carried out with a gradient of 10° C./min. The fall in temperature can be regulated, for example, down to 1000° C. with a gradient of 10° C./min. The fall in temperature from the target temperature to ambient temperature is subsequently carried out by following the thermal inertia of the furnace used to carry out this heat treatment.

Figure 2:
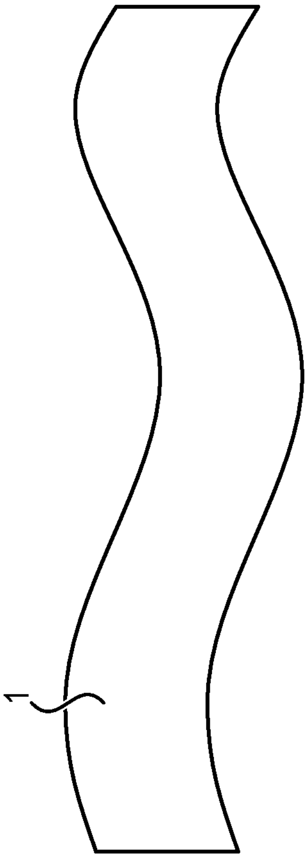
FIG. 2 is a diagram illustrating the deformation of the polycrystalline silicon carbide slab brought about by the stage of heat treatment.

As represented in FIG. 2, the heat treatment is liable to bring about a deformation (bow, warp) of the slab 1. The thinning of the slab is then adapted in order to comprise (if appropriate, to consist of) a correction, by removal of material from the polycrystalline silicon carbide slab, of the deformation brought about by the heat treatment. The removal of material is typically adapted locally so that the slab is not thinned in the same way at every point. There emerges, from this correction of the deformation, a decrease in the value of bow or of warp observed after the heat treatment.

Figure 3:
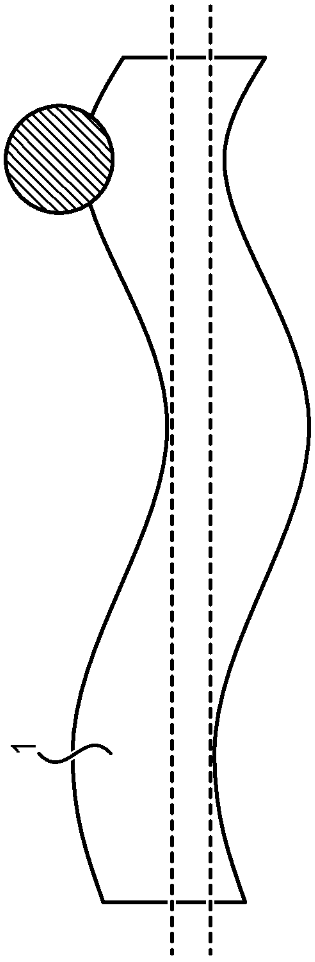
FIG. 3 is a diagram illustrating the correction, by removal of material, of the deformation brought about by the heat treatment.
Figure 4:
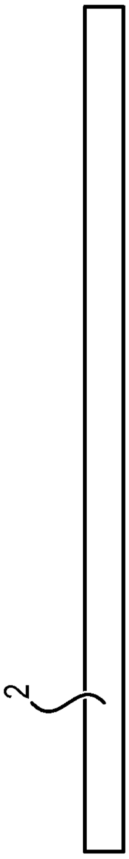
FIG. 4 is a diagram illustrating a polycrystalline silicon carbide wafer obtained by the implementation of the present disclosure.

FIG. 3 illustrates a possible implementation of this thinning, in this instance carried out until the parallel dotted lines are reached. For its part, FIG. 4 illustrates the wafer 2 obtained in accordance with the present disclosure from the slab 1 of FIG. 1.

According to a possible embodiment, the removal of material targeted at correcting the deformation brought about by the heat treatment is carried out by grinding the p-SiC slab. In another embodiment, this removal of material is carried out by electrical discharge machining. The removal of material by electrical discharge machining exhibits the advantage, in comparison with grinding, of being able to be carried out without contact with the slab and without artificially creating the deformation by elastic bending. In yet another embodiment, the removal of material combines electrical discharge machining and grinding. In this latter embodiment, the electrical discharge machining can carry out a coarse thinning, while the grinding carries out a finer thinning.

In an implementational example, the thinning comprises, in succession, a very coarse thinning (by electrical discharge machining or grinding), which will remove, for example, a thickness of the order of 150 μm or more, a coarse grinding, which will remove, for example, a thickness of the order of 20 μm, and a fine grinding, which will remove, for example, a thickness of the order of 3 μm. The different grinding operations differ in the size of the grains of the grinding wheel used, these grains being increasingly small in the sequence of the grinding operations.

Optionally, a mechanical or chemical-mechanical polishing stage is carried out after the final grinding stage.

As represented by FIG. 3, the thinning can be carried out both at the front face and at the rear face of the p-SiC slab. And, as represented by FIGS. 3 and 4, this thinning is preferentially carried out so that the front and rear faces of the wafer obtained on conclusion of the process are flat and parallel to one another. These front and rear faces of the wafer 2 are not necessarily parallel to the front and rear faces of the starting slab 1.

By way of example, the thinning will remove a thickness at least equal to the value of deformation after the heat treatment minus 25 μm.

Generally, the thickness removed from each of the faces of the slab during the thinning following the heat treatment is, for example, greater than or equal to 50 μm, in particular, greater than or equal to 100 μm, indeed even greater than or equal to 150 μm.

The thinning is, in particular, such that it results in a self-supporting wafer, that is to say the thickness of which is such that it does not break or deform plastically under the effect of its own weight. Such a thickness is, for example, greater than or equal to 200 μm, in particular, greater than or equal to 300 μm.

In particular, a thickness of between 175 μm and 200 μm can be removed from each of the faces of the slab, for a thinning of 350 to 400 μm in total. A wafer with a thickness of between 325 et 375 μm can thus be obtained from a slab that has been subjected to a first thinning before the heat treatment leading it to a thickness of 725 μm.

The thinning of the slab can be followed by stages of surface finishing of the wafer targeted, in particular, at rendering it smoother.

The present disclosure furthermore extends to a process for the manufacture of a composite structure, comprising the manufacture of a p-SiC wafer as set out above and the transfer of a thin layer made of single-crystal silicon carbide from a single-crystal silicon carbide substrate to the polycrystalline silicon carbide wafer. This transfer can be carried out according to the SmartCut™ technology and thus comprise an implantation of ionic entities in the single-crystal silicon carbide substrate so as to form therein a weakened plane delimiting the thin layer to be transferred, the bonding of the single-crystal silicon carbide substrate with the polycrystalline silicon carbide wafer (if appropriate via one or more bonding layers), then the detachment (brought about by a heat treatment, a mechanical action or a combination of these means) of the single-crystal silicon carbide substrate along the weakened plane, so as to transfer the thin active layer to the polycrystalline silicon carbide wafer. The process for the manufacture of the composite structure can additionally comprise the formation of electronic components, in particular, of power or radiofrequency components, in the transferred thin layer.

The fact of providing a heat treatment upstream of the wafering process makes it possible to avoid an excessive deformation of the wafer once the latter has been thinned and levelled under the effect of its subsequent exposure to high temperatures.

When the heat treatment is carried out after the separation of the slab and of the growth substrate, the treatment does not bring about additional deformation of the slab, which would be linked to the stresses exerted by the growth substrate on the slab during the heating of the slab/substrate assembly. This contributes all the more to improving the flatness and the stability of the final wafer.

According to an alternative form that can be envisaged, the stage of heat treatment is shared with the stage of removal by combustion of the support substrate made of graphite. For example, during this stage, it is the assembly formed by the wafer 2 and the support substrate that is brought to a temperature of greater than or equal to 1650° C. as mentioned above, in the presence of oxygen, so as to bring about the combustion of the graphite while thermally treating the slab 1. According to another embodiment that can be envisaged, the stages of removal by combustion and of heat treatment are carried out successively, preferably in this order, in the same furnace. In this case, the furnace is first heated to 800° C. or more in the presence of oxygen, then heated above 1650° C., for example, under a neutral atmosphere after the oxygen injected has been purged from the furnace.

The invention claimed is:

1. A method of manufacturing a polycrystalline silicon carbide wafer, comprising:

forming a polycrystalline silicon carbide slab by depositing polycrystalline silicon carbide on a growth substrate;

separating the slab and the growth substrate;

after the separating the slab, performing a heat treatment of the polycrystalline silicon carbide slab; and thinning the polycrystalline silicon carbide slab, the thinning comprising a correction, by removal of material from the polycrystalline silicon carbide slab, of a deformation brought about by the heat treatment.

2. The method of claim 1, wherein the removal of material is carried out by grinding the polycrystalline silicon carbide slab.

3. The method of claim 2, wherein the removal of material is carried out both at a front face and at a rear face of the polycrystalline silicon carbide slab.

4. The method of claim 3, wherein the removal of material is carried out so that the polycrystalline silicon carbide wafer exhibits front and rear faces that are flat and parallel to each other.

5. The method of claim 4, wherein the thinning comprises the removal, on at least one of the faces of the slab, of a thickness of the material of greater than or equal to 50 micrometers.

6. The method of claim 1, wherein the removal of material from the polycrystalline silicon carbide slab is carried out by electrical discharge machining.

7. The method of claim 6, wherein the removal of material is carried out both at a front face and at a rear face of the polycrystalline silicon carbide slab.

8. The method of claim 7, wherein the removal of material is carried out so that the wafer exhibits front and rear faces that are flat and parallel to each other.

9. The method of claim 8, wherein the thinning comprises the removal, on at least one of the faces of the slab, of a thickness of the material of greater than or equal to 50 micrometers.

10. The method of claim 1, wherein the removal of material is carried out both at a front face and at a rear face of the polycrystalline silicon carbide slab.

11. The method of claim 10, wherein the removal of material is carried out so that the wafer exhibits front and rear faces that are flat and parallel to each other.

12. The method of claim 1, wherein the thinning comprises the removal, on at least one of the faces of the slab, of a thickness of the material of greater than or equal to 50 micrometers.

13. The method of claim 1, wherein the heat treatment is carried out at a temperature of between 1650° C. and 2000° C. for a period of time of greater than 10 minutes.

14. The method of claim 13, in wherein the heat treatment comprises a stationary phase at 1850° C.

15. The method of claim 13, wherein the heat treatment comprises a stationary phase in which temperature is maintained steady for a period of time and a cooling phase in which temperature is decreased in a controlled manner to a target temperature.

16. The method of claim 1, wherein the heat treatment is carried out at a temperature greater than a temperature of the deposition of the polycrystalline silicon carbide on the growth substrate.

17. A method of manufacturing a composite structure, the method comprising:

forming a polycrystalline silicon carbide slab by depositing polycrystalline silicon carbide on a growth substrate;

separating the slab and the growth substrate;

after the separating the slab, performing a heat treatment of the polycrystalline silicon carbide slab;

thinning the polycrystalline silicon carbide slab to form a polycrystalline silicon carbide wafer, the thinning comprising a correction, by removal of material from the polycrystalline silicon carbide slab, of a deformation brought about by the heat treatment; and transferring a thin layer made of single-crystal silicon carbide from a single-crystal silicon carbide substrate to the polycrystalline silicon carbide wafer.

18. The method of claim 17, further comprising forming electronic components in the transferred thin layer at a temperature lower than the temperature of the heat treatment.

* * * * *